United States Patent [19]

Thornton

[11] Patent Number: 6,002,705
[45] Date of Patent: Dec. 14, 1999

[54] WAVELENGTH AND POLARIZATION MULTIPLEXED VERTICAL CAVITY SURFACE EMITTING LASERS

[75] Inventor: Robert L. Thornton, Los Altos, Calif.

[73] Assignee: Xerox Corporation, Stamford, Conn.

[21] Appl. No.: 08/984,464

[22] Filed: Dec. 3, 1997

[51] Int. Cl.$^6$ .............................. H01S 3/08; H01S 3/085; H01S 3/103
[52] U.S. Cl. ............................... 372/96; 372/45; 372/50; 372/27; 372/103
[58] Field of Search ................................ 372/96, 45, 50, 372/27, 103

[56] References Cited

U.S. PATENT DOCUMENTS

| | | | |
|---|---|---|---|
| 5,243,359 | 9/1993 | Fisli | 346/1.1 |
| 5,331,654 | 7/1994 | Jewell et al. | 372/45 |
| 5,394,423 | 2/1995 | Kasahara | 372/45 |
| 5,412,680 | 5/1995 | Swirhun et al. | 372/45 |
| 5,465,263 | 11/1995 | Bour et al. | 372/23 |
| 5,778,018 | 7/1998 | Yoshikawa et al. | 372/45 |

OTHER PUBLICATIONS

R.A. Kiehl, M. Yamaguchi, O. Ueda, N. Horiguchi, N. Yokoyama; Patterned Self–Assembly of One–Dimensional arsenic Particle Arrays in GaAs by controlled Precipitation, Appl. Phys. Lett 68 (4),Jan. 22, 1996, pp. 478–480.

F. Koyama, T. Mukaihara, Y. Hayashi, N. Ohnoki, N. Hatori, K. IGA; Wavelength Control of Vertical Cavity Surface–Emmitting Lasers by Using Nonplanar MOVCD, IEEE Photonics Technology Letters, vol. 7, No. 1, Jan. 1995, pp. 10–12.

T. Yoshikawa, H. Kosaka, K. Kurihara. M. Kajita, Y. Sugimoto, K. Kasahara; Complete Polarization Control of 8 ×8 Vertical–Cavity Surface–Emitting Laser Matrix Arrays; Appl. Phys. Lett 66 (8),Feb. 20, 1995, pp. 908–910.

R.A. Kiehl. M. Saito, M. Yamaguchi, O. Ueda, N. Yokoyama; Lateral Patterning of Arsenic Precipitates in GaAs by a Surface Stress Structure, Appl. Phys. Lett 66 (17),Apr. 24, 1995, pp. 2194–2196.

H. Saito, I. Ogura, Y. Sugimoto, K. Kasahara; Monolithic Integation of Multiple Wavelength Vertical–Cavity Surface–Emitting Lasers by Mask Molecular Beam Epitaxy; Appl. Phys. Lett 66 (19), May 8, 1995, pp. 2466–2468.

Jung–Hoon Ser, Young–Gu Ju, Jae–Heon Shin, Y. H. Lee; Polarization Stabilization of Vertical Cavity Top–Surface–Emmiting Lasers by inscription of Fine Metal–Interlaced Gratings;Appl. Phys. Lett 66 (21), May 22, 1995, pp. 2769–2771.

Stephen Y. Chou, Wenyong Deng; Subwavelength Amorphous Silicon Transmission Gratings and Applications in Polarizers and Waveplates; Appl. Phys. Lett 67 (6), Aug. 7, 1995, pp. 742–744.

D. Vakhshoori, R. E. Leibenguth; Experimental Observation of Vertical Cavity with Polarization Birefringence Using Asymmetric Superlattice; Appl. Phys. Lett 67 (8), Aug. 21, 1995, pp. 1045–1047.

T. Mukaihara, F. Koyama, K. IGA; Engineered Polarization Control of GaAs/AIGaAs Surface–Emitting Lasers by Anisotropic Stress from Elliptical Etched Substrate Hole; IEEE Photonics Technology Letters vol. 5 No. 2, Feb. 1993, pp. 133–135.

*Primary Examiner*—Rodney Bovernick
*Assistant Examiner*—Sung T. Kim

[57] ABSTRACT

The present invention relates to a vertical cavity surface emitting laser device comprising a plurality of semiconductor layers formed upon a substrate and capable of emitting a laser beam of a selected wavelength and a selected polarization, wherein said polarization is established by the presence of stress inducing elements disposed on said free surface of the laser device which induce a stress in the active layers of the laser device. The stress inducing elements are made of a material having a higher coefficient of thermal expansion than the material which comprises the surface layer of the laser device.

16 Claims, 3 Drawing Sheets

WAVELENGTH AND POLARIZATION MULTIPLEXED VERTICAL CAVITY SURFACE EMITTING LASERS

FIELD OF THE INVENTION

This invention relates to improved vertical cavity surface emitting laser ("VCSEL") arrays.

BACKGROUND OF THE INVENTION

Closely-spaced, independently-addressable, solid state laser arrays are important devices in current high-speed xerographic printing technology. Generally, in xerographic printing, an electrostatic image (also known as a latent image)is formed on a photoreceptor before producing a permanent image on a recording medium such as paper. To form a latent image, the entire surface of the photoreceptor is first uniformly, electrostatically, charged. Then, the photoreceptor is illuminated in an image-wise manner in order to discharge selected (image or non-image) areas. One common illuminator is a modulated laser beam which is directed onto a scanning device, such as is a rotating, multi-faceted, mirrored polygon which deflects the laser light onto selected areas of the photoreceptor. Rotating polygon mirrors and their related optics are generically referred to as ROSs (Raster Output Scanners). The areas exposed to the laser beam are discharged, resulting in a pattern charged and discharged areas on the photoreceptor. This pattern, which is the latent image, is then made visible (i.e. developed) by bringing very fine toner particles into contact with the photoreceptor. The toner adheres to selected areas of the photoreceptor and is then transferred to a recording medium.

Full-color printing is usually accomplished by forming and developing four latent images, as described above, and then transferring the individual developed images in registration on a recording medium. The photoreceptor is sequentially scanned four times by the ROS, with image information for black and color separations for each of the three primary colors.

By utilizing multiple laser beams, as described in U.S. Pat. No. 5,243,359 entitled "Raster Output Scanner For A Multistation Xerographic Printing System" by T. Fisli, four laser beams, the speed of color xerographic printing may be greatly increased. As disclosed, a multiple wavelength, multi-laser array of single discrete lasers is utilized; one for each color separation and black. The four laser beams simultaneously strike a single raster output polygon mirror and a single set of scan optics, and are then separated by optical filters, and each beam is directed to a separate photoreceptor for printing one color. Then the separate images are transferred to a suitable record medium. Of course, registration of the color separations is imperative. In order to ensure that the color image produced by each photoreceptor is in registration, the laser beams should ideally originate from a common spatial location so that they share a common optical axis with respect to the rotating polygon mirror. Therefore, in practice, the laser beams should be as close to one another as possible.

It is also important that the emitting regions in the monolithic laser array structure are individually addressable and that the emitted, closely spaced beams may be individually detected and processed. Thus, any information contained as a result of beam modulation at the source or reflected by transmission through the optical path should be readily captured. There are several ways to generate beams with unique characteristics that will make the beams easier to separate or detect. One way is to change the wavelengths; a second way is to change the polarization. In both cases, there must be sufficient separation so that the optical filters can effectively isolate each beam.

For individual edge emitting lasers in a monolithic array to have independently separable wavelengths, the difference in wavelength between any two lasers generally has to be on the order of at least 50 nanometers (nm). As discussed previously, since there are four colors for full-color printing, four laser beams with wavelengths that span at least 150 nm would be required to implement this approach. To make a four-laser monolithic array with such a span of wavelengths, the use of two semiconductor material systems is generally required. For instance, an $Al_xGa_{1-x}As$ material system produces lasers with wavelengths from approximately 750 nm to 850 nm while an AlGaInP material system produces lasers from approximately 630 to 700 nm. By incorporating both material systems, it is possible to produce an array with a wavelength separation of at least 150 nm. Of course, the processing of dual material system arrays is more complex and expensive than the processing of single material system arrays.

Where four discrete and separable lasers are needed it is possible to combine several wavelengths and several polarizations in a single array. For example, in U.S. Pat. No. 5,465,263, entitled "Monolithic Multiple Wavelength Dual Polarization Laser Diode Arrays" by Bour et al, there is disclosed a linear monolithic multiple wavelength, dual polarization edge emitting laser array. Thus, in a four laser array, as needed in a four color system, the wavelength separation required is reduced from 150 nm to 50 nm, since the number of separable sources is doubled by taking advantage of the orthogonal polarizations.

Although edge emitting laser arrays are currently used in the vast majority of applications, vertical cavity surface-emitting lasers ("VCSELs") offer several advantages over edge emitting laser arrays. For instance, (1) VCSELs can be fabricated in closer packed arrays than edge emitting lasers; (2) the beam of a VCSEL has a small and circular angular divergence; (3) a VCSEL's mirrors are monolithically incorporated into its design, thus allowing for on wafer testing, whereas edge emitting lasers are not complete until the wafer is cleaved into individual devices; and (4) VCSELs can be monolithically grown in one-dimensional or two-dimensional arrays, whereas monolithic edge emitting lasers can only be grown in one dimensional arrays.

Therefore, it is an object of the present invention to provide a two-dimensional monolithic array of VCSEL lasers which can operate efficiently at several wavelengths with controllable linear polarizations.

BRIEF SUMMARY OF INVENTION

The present invention relates to a vertical cavity surface emitting laser device comprising a plurality of semiconductor layers formed upon a substrate and capable of emitting a laser beam of a selected wavelength and a selected polarization, wherein said polarization is established by the presence of stress inducing elements disposed on said free surface of the laser device which induce a stress in the active layers of the laser device. The stress inducing elements are made of a material having a higher coefficient of thermal expansion than the material which comprises the surface layer of the laser device. It is also an object of the present invention to provide an array of vertical cavity surface emitting laser devices, each emitting a laser beam of a different wavelength, wherein at least one of the laser devices is formed over a patterned portion of the substrate.

The advantages and objects of the present invention will become apparent to those skilled in the art from the following detailed description of the invention, its preferred embodiments, the accompanying drawings, and the appended claims.

DETAILED DESCRIPTION OF PREFERRED EMBODIMENTS

Figure 1:
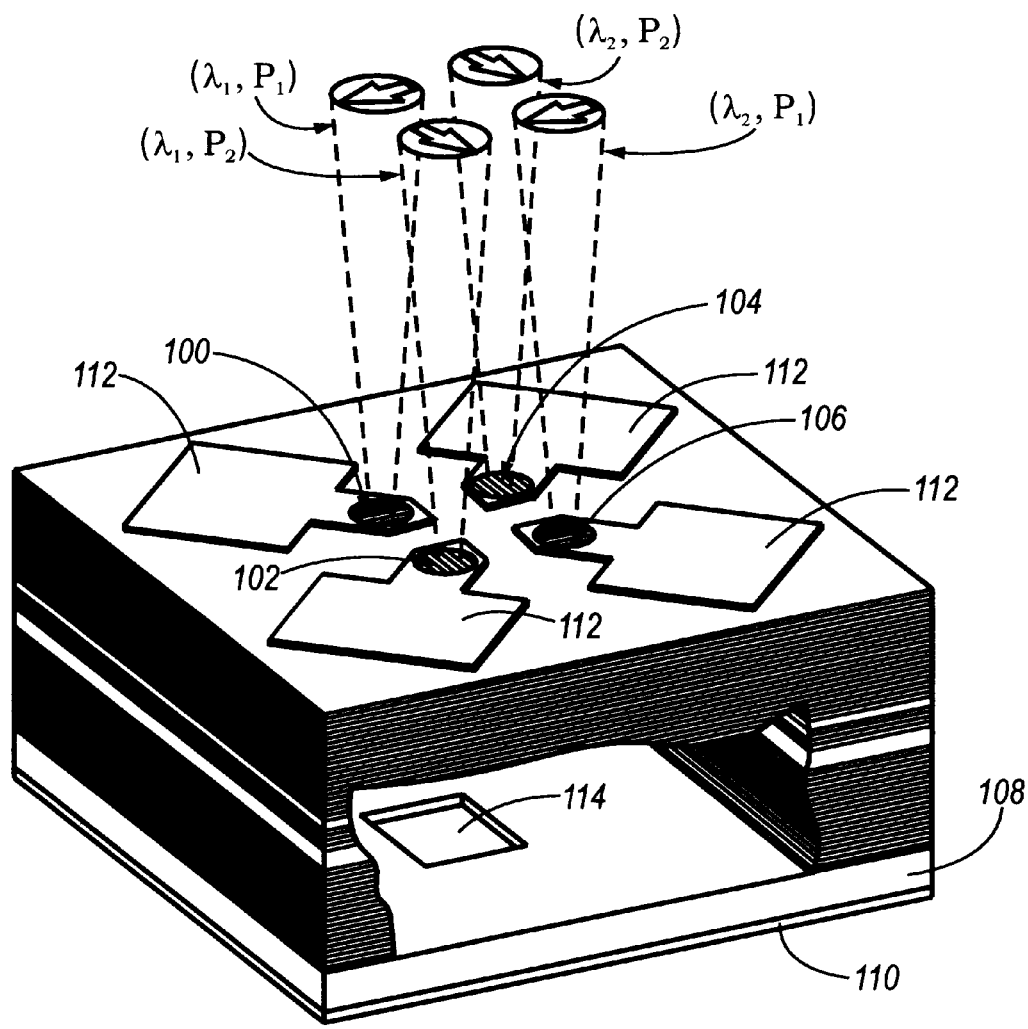
FIG. 1 is a perspective view of an array of four vertically emitted laser beams, each of which emits radiation at a different combination of polarization and wavelength.

FIG.1 schematically illustrates laser beams emanating from a two-dimensional array comprising four VCSELs. The beams emanating from lasers 100, 102, 104 and 106 are each differentiable from the others by a unique combination of wavelength and polarization. For example, laser 100 has wavelength $\lambda_1$ and polarization $P_1$, laser 102 ($\lambda_1$, $P_2$), laser 104 ($\lambda_2$, $P_2$), and laser 106 ($\lambda_2$, $P_1$). As indicated by arrows, polarizations $P_1$ and $P_2$ are both parallel to the plane of the top surface of the array, with $P_1$ being parallel to the front face of the array and $P_2$ being perpendicular to the front face of the array. The lasers, which will be described in detail below, each are formed by a series of layers deposited upon substrate 108. Bottom contact 110 and top contacts 112 complete the illustrated structure. In the cutaway portion of the drawing, there is shown the preferred manner by which the two wavelengths are enabled. Laser 102, with longer wavelength $\lambda_1$, is formed over trench 114 in the top surface of substrate 108, while laser 106, with shorter wavelength $\lambda_2$, is formed over the normal top surface of the substrate.

Figure 2:
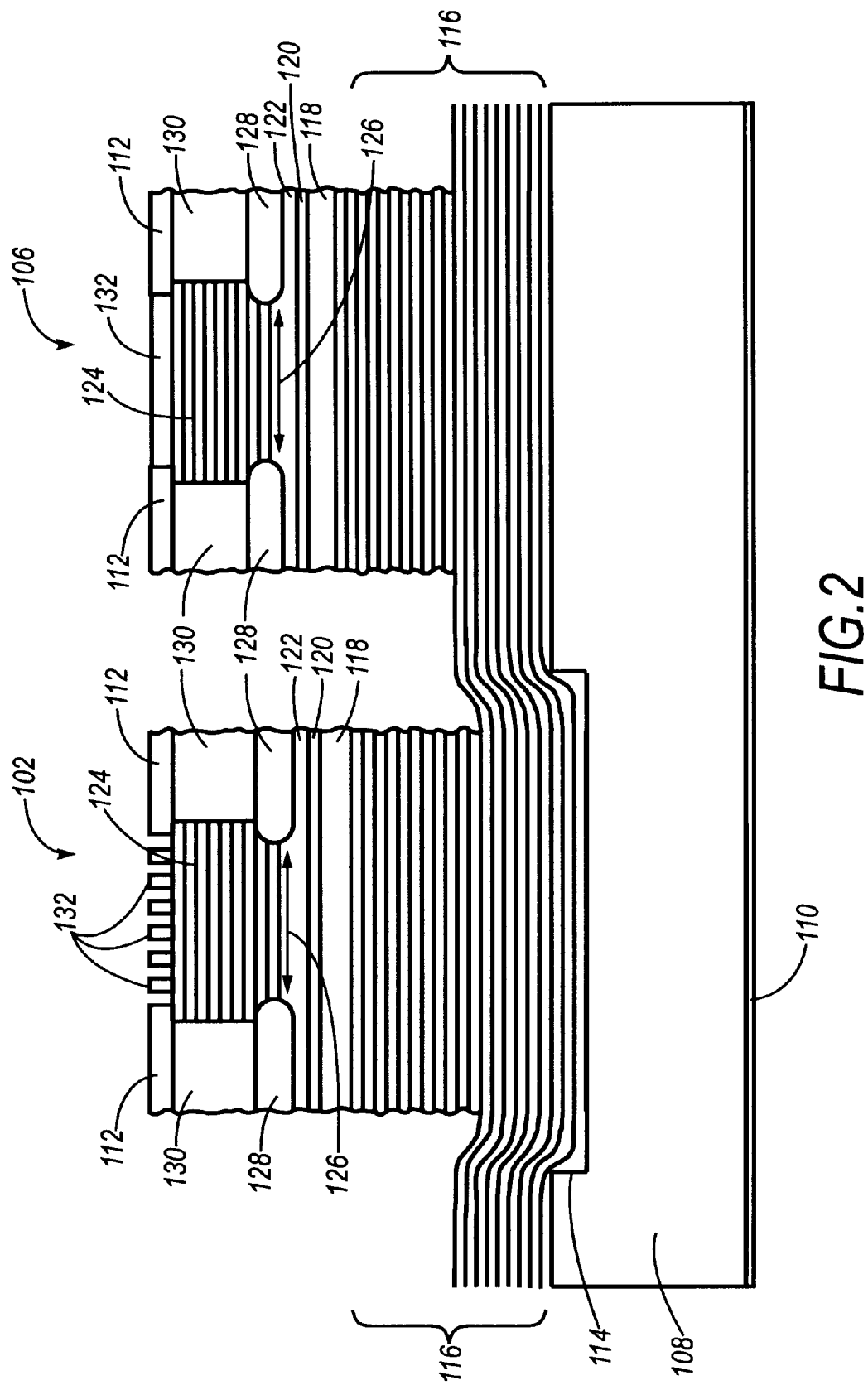
FIG. 2 illustrates the cross-sectional view of two vertical cavity surface emitting laser structures, each of which emits a different wavelength.

FIG. 2 schematically illustrates VCSEL structures 102 and 106. For ease of understanding, the lasers are shown as discrete devices rather than in situ within the multilayer structure of FIG. 1. The lasers are fabricated to lase at different wavelengths by growing one (VCSEL 106) on the planar surface of substrate 108 and the other (VCSEL 102) in trench 114. During the growth process, each of a plurality of layers is epitaxially grown over the entire substrate, such that the portion of each layer grown within (and subsequently, over) the trench will undergo a more rapid growth rate. It is disclosed in "Wavelength Control of Vertical Cavity Surface-Emitting Lasers by Using Nonplanar MOCVD" by Koyama et al, IEEE Photonics Technology Letters, Vol, 7, No. 1, pp. 10–12, January 1995 to use substrate patterning to achieve on wafer wavelength control. While in this reference mesas rather than trenches are used, it is the presence of the topological perturbation which affects the growth rate of the epitaxially deposited layers. As the atoms of aluminum and gallium are being deposited on the substrate, those closer to an edge will have a higher mobility and will grow to a thicker layer in a given unit of time. Since this edge effect decays over a distance of several tens of microns, it is possible to obtain a series of thicker layers within a trench, or upon a mesa, by dimensioning the surface perturbation well within the zone of decay. The thicker layers will propagate upwardly throughout the entire laser device and result in a laser having a longer wavelength than a laser unaffected by the aforesaid edge effect, by altering the resonant frequency of its optical cavity.

Turning now to the laser device structure itself, a series of semiconductor layers are preferably formed by an epitaxial process such as metal-organic chemical vapor deposition ("MOCVD") on an n-type GaAs substrate 108, which is typically doped in the range of $5 \times 10^{18} \text{cm}^{-3}$. While other deposition processes, such as liquid phase epitaxy ("LPE"), molecular beam epitaxy ("MBE"), or other known crystal growth processes, may be used, they may not have the same growth rate control. The substrate will have already been patterned by the formation therein of trench 114 which is approximately 10 microns ($\mu$m) in depth and 20 to 50 microns square, depending upon the selected wavelength for the laser. Alternatively, the trench could be rectangular in shape and underlie both VCSELs 102 and 100. Each of the laser devices includes a lower, n-type, superlattice structure 116, forming a lower distributed Bragg reflector ("DBR") mirror which will provide the necessary internal reflection. If desired, a buffer layer of about 200 to 800 nanometers (not shown) may be inserted between the substrate 108 and the superlattice structure.

The superlattice structure 116 typically comprises multiple pairs of AlAs and AlGaAs layers. The AlGaAs layer typically has a low aluminum content, in the range of 10% to 15%, sufficient so that it is non-absorptive at the lasing wavelength. It should also be sufficiently low so that the material achieves the desirable goal of maximal refractive index. A typical target refractive index of the AlGaAs layers is around 3.5 to 3.6, while a typical refractive index of the AlAs layer is approximately 3.1. The total thickness of each layer pair is designed to be equal to one half of the desired optical wavelength. It is well-known that the reflectivity of the lower DBR 116 is generally a function of the difference in the refractive indices between the AlAs layer and the AlGaAs layers of the superlattice. The reflectivity is also a function of the number of layer pairs in the structure. Since light is outcoupled through the top surface of the semiconductor structure, the reflectivity of the lower DBR 116 should be as close to 100% as possible, in order to achieve high internal reflection which generally reduces the threshold current of the laser. The greater the difference in the refractive indices, the fewer number of pairs are required. Typically, 20 to 40 pairs of AlAs and AlGaAs layers are used to form the lower DBR structure 116. After the growth of a number of layer pairs, a final AlAs layer, whose thickness is designed to be a quarter of the optical wavelength, is deposited before growing a lower confinement layer 118 of the optical cavity. A typical desired output wavelength range is 760 to 830 nanometers. Instead of AlAs, AlGaAs with a substantial mole fraction of Al may also be used. The resulting increased refractive index of this layer may be compensated for by increasing the number of layer pairs in the mirror.

The lower confinement layer 118 comprises AlGaAs which has an aluminum content of about 40% and a thickness of approximately 100 nanometers. It is doped with silicon to a concentration of approximately 1 to $3 \times 10^{18} \text{cm}^{-3}$. Generally, the top 20 nanometers of this layer, adjacent to the active layer, remain undoped. An active layer 120 which comprises three to four quantum wells, each with a thickness of five to ten nanometers is deposited over the layer 118. The quantum wells are typically formed by pairs of GaAs well layers and AlGaAs barrier layers (neither shown) with a 20% mole fraction. Instead of GaAs, $In_xGa_{1-x-y}Al_yAs$ may also be used. Of course, a single quantum well or other multiple quantum well structures ("MQW") may be used to form the active layer 120, as is well understood.

Above the active layer 120 is an upper AlGaAs confinement layer 122, which is structurally similar to the lower AlGaAs confinement layer 118 and also has an aluminum content of about 40% and a thickness of about 100 nanometers. This layer, is doped with magnesium to a concentration of approximately 1 to $3 \times 10^{18} \text{cm}^{-3}$. Generally, the bottom 20 nanometers of this confinement layer 108, adjacent to the active layer, remain undoped. The two AlGaAs confinement layers, 118 and 122, along with the active layer 120, form the optical cavity in which the desired optical gain can be attained.

Above the upper AlGaAs confinement layer 122 is a p-type superlattice 124, which forms an upper DBR mirror which is magnesium doped. The upper DBR mirror is structurally similar to the lower DBR mirror 116 except for the polarity of its dopants. Typically, 15 to 25 pairs of alternating AlAs and AlGaAs layers are used to form this upper DBR mirror 124. Similarly, the mirror layer closest to the active region generally has a high aluminum content. The reflectivity of the upper DBR 124 is typically 98% to 99% because light will be outcoupled through the surface of the device. Then an additional $p^{30}$-type GaAs layer of approximately 10 nanometers (not shown) may also be deposited for the formation of low resistance p-type contacts.

For the purpose of wavelength adjustment, one might expect to achieve a growth rate difference of 4–5% between trench regions and non-trench regions. If we assume that the trench widths are designed to yield a growth rate enhancement of 4%, then, for the total thickness of the epitaxial layers, the epitaxy thickness might increase from 7 microns to 7.28 microns. If this structure was designed to have a wavelength of 800 nm in the non-trench region, the wavelength in the trench region would increase to 832 nm, for a wavelength difference of 32 nm. The exact extent of the wavelength difference between the trench and non-trench regions can be adjusted by adjusting the width of the trench.

After all the epitaxial layers have been deposited, the lasing emissive region or "aperture" 126 is formed by ion implantation through the top surface to form ion implanted regions 128. Typically, a high energy implantation of hydrogen ions through a suitable mask at 300 to 400 keV at a dose of 1 to $3 \times 10^{14} \text{cm}^{-2}$ will produce these regions. Isolation regions 130 are also formed by ion implantation through a photoresist mask at energies ranging from 50 to 400 keV at doses of 1 to $5 \times 10^{15} \text{cm}^{-2}$. These regions serve to provide electrical isolation between the individual devices in the array.

Figure 3:
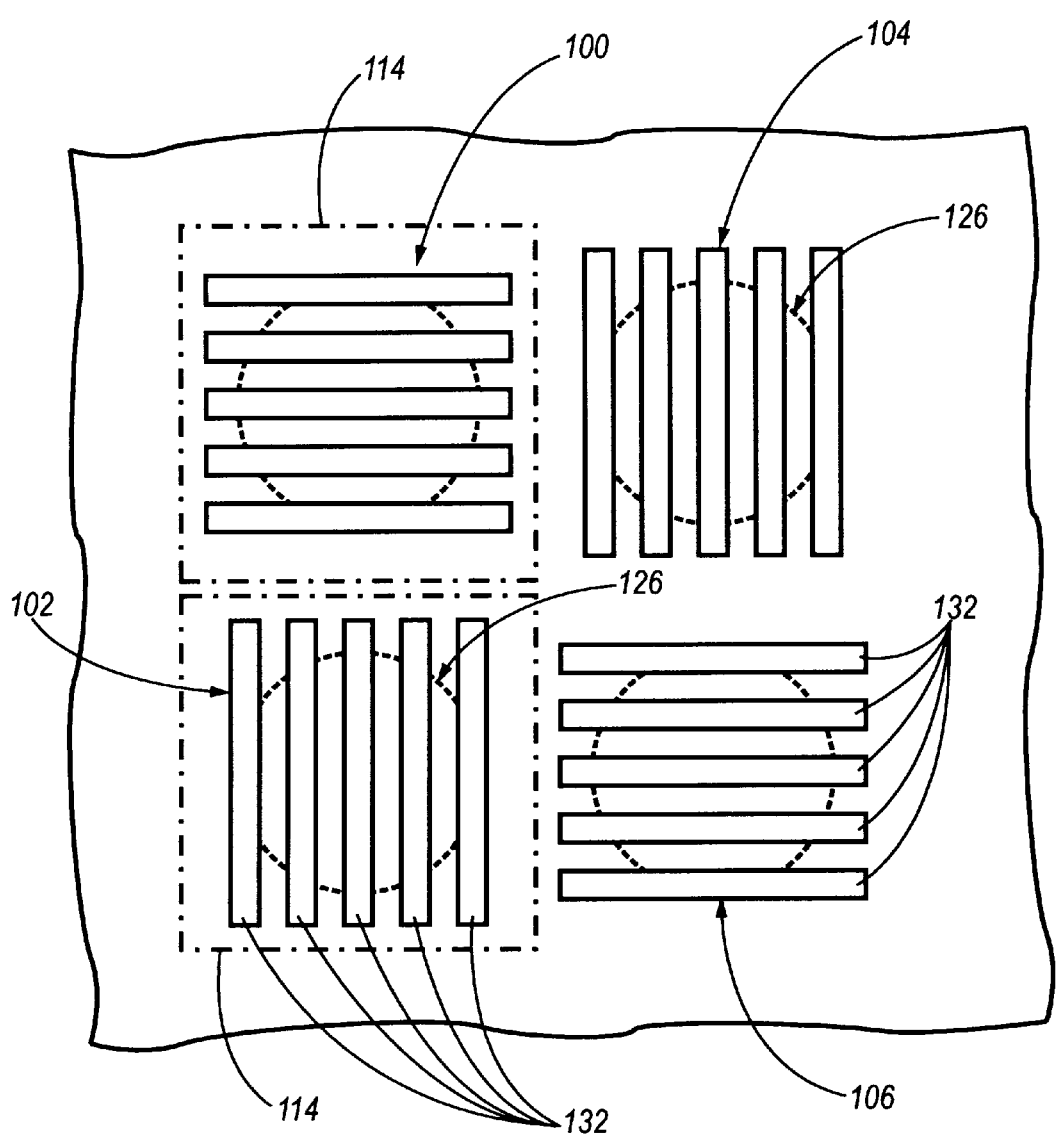
FIG. 3 illustrates a schematic top view of four vertical cavity surface emitting laser structures, each of which emits radiation at a different combination of polarization and wavelength.

The polarization direction of the laser beams is established by an array of stressor elements 132 formed on the top surface of each VCSEL device in the region overlying the aperture 126, as can be seen in FIGS. 2 and 3. Stressor elements 132 over VCSELs 100 and 106 extend parallel to the front face of the array (as shown in FIG. 1) and the stressor elements 132 over VCSELs 102 and 104 extend perpendicular to the front face of the array. These elements comprise thin narrow stripes of a material having a coefficient of thermal expansion substantially different than the GaAs layer upon which it is deposited. They are deposited as a layer and then patterned at a high temperature and, when cooled, will shrink substantially more or less than the underlying GaAs layer so as to impart polarization affecting stress to the device by creating a directional strain field in the active regions. The stressor elements are on the order of 4 microns above the active region and the penetration depth of the stress field imparted by the differential contraction is generally directly proportional to the dimension of the stressor element in the dimensional direction. Thus, a stressor element stripe approximately 2 μm wide by 15 μm long would have a significantly deeper penetration along its length direction. The introduced stress will affect the optical refractive index and the gain along the stress direction which imparts the preferred orientation to the polarization.

The preferred material for the stressor elements is silicon nitride which has the requisite coefficient of expansion and is optically transparent so as not to interfere with the laser beams exiting the devices. The coefficient of thermal expansion of silicon nitride typically ranges from 2.5 to $3.0 \times 10^{-6}/°$ C. while the thermal expansion coefficient of GaAs typically ranges from 5.2 to $6.80 \times 10^{-6}/°$ C. In addition, the silicon nitride stripes are typically deposited at approximately 800° C. Other materials such as silicon dioxide, boron nitride, or silicon, may also be used to form the stressor elements.

These stressor elements, 132, are made of silicon nitride strips, which are transparent to radiation in the infrared and visible wavelength ranges. These nitride strips will have no effect on the mirror reflectivity if they are designed to have an optical thickness of one half of the laser emission wavelength.

The vertical distance ("d") between the stressor element and the active region is about 4 microns. The precise subsurface field pattern in the plane of the active region is quite complicated. However, the elongated stressor element will exert a strain field which is anisotropic and of greatest magnitude in the direction of its greatest length. Since the strength of this field falls off in the ratio of $1/d^2$, the penetration depth of this field is increased with increasing stressor length. For example, a stressor element with a length of 15 microns should be sufficient.

After all the epitaxial layers and the stressor elements have been deposited, upper p-type contacts 112 are formed to allow the biasing of the laser structures. An n-type contact 110 is formed on the backside of the GaAs substrate 108. A typical p-type contact is formed by using titanium/gold. The n-type bottom contact formed on the underside of the structure is, typically, germanium/gold.

The composition, dopants, doping levels, and dimensions given above are exemplary only, and variations in these parameters are permissible. Additionally, other layers in addition to the ones shown in the figures may be included. Variations in experimental conditions such as growth temperature, time, and ion implant energies are also permitted. Lastly, instead of GaAs and GaAlAs, other semiconductor materials such as GaAlSb, InAlGaP, InGaAlN or other III–V or II–VI alloys may also be used.

While the invention has been described in conjunction with specific embodiments, it is evident to those skilled in the art that alternatives, modifications, and variations will be apparent in light of the foregoing description. Accordingly, the invention is intended to embrace all other such alternatives, modifications, and variations that fall within the spirit and scope of the appended claims.

What is claimed is:

1. A vertical-cavity surface-emitting laser device comprising:
    a substrate;
    a plurality of semiconductor layers disposed upon said substrate including
        a first reflector;
        a series of active layers, disposed on said first reflector; and
        a second reflector disposed on said active layers, wherein at least one of said first and second reflectors allows transmission of light energy;

means for defining a laser emitting aperture in said plurality of active layers and for controlling current flowing through said active layers;

a first electrode disposed on one side of said substrate a second electrode disposed on the surface of said plurality of semiconductor layers, whereby said first and second electrodes enable electrical biasing of said active layers; and stress inducing elements comprising a plurality of parallel stripes of a material having a long dimension and a short dimension disposed on the surface of said plurality of semiconductor layers which impart a selected polarization to a laser beam emitted from said laser device in the direction parallel to said long dimension of said stripe.

2. The vertical-cavity surface-emitting laser device of claim 1 wherein said stress inducing elements induce a stress field in said active layers.

3. The vertical-cavity surface-emitting laser device of claim 2 wherein said stress inducing elements comprise a material having a different coefficient of thermal expansion than the material which comprises the surface layer of said plurality of semiconductor layers upon which said stress inducing elements is disposed.

4. The vertical-cavity surface-emitting laser device of claim 3 wherein the coefficient of thermal expansion of said stress inducing element material is higher than the coefficient of thermal expansion of the material which comprises the surface layer of said plurality of semiconductor layers.

5. The vertical-cavity surface-emitting laser device of claim 3 wherein the coefficient of thermal expansion of said stress inducing element material is in the range of 2.5 to $3.0 \times 10^{-6}/°$ C. and the coefficient of thermal expansion of said surface layer is in the range of 5.2 to $6.80 \times 10^{-6}/°$ C.

6. The vertical-cavity surface-emitting laser device of claim 1 wherein the vertical distance from surface of said plurality of semiconductor layers to said active layers is on the order of twice said short dimension.

7. The vertical-cavity surface-emitting laser device of claim 1 wherein the vertical distance from surface of said plurality of semiconductor layers to said active layers is on the order of one fourth said long dimension.

8. The vertical-cavity surface-emitting laser device of claim 3 wherein the material of said stress inducing elements is transparent to a laser beam emitted from said laser device.

9. The vertical-cavity surface-emitting laser device of claim 8 wherein the material of said stress inducing elements comprises silicon nitride.

10. The vertical-cavity surface-emitting laser device of claim 1 wherein the portion of said substrate over which laser device is disposed is patterned.

11. The vertical-cavity surface-emitting laser device of claim 10 wherein said patterned portion of said substrate comprises a trench.

12. A dual-beam vertical-cavity surface emitting laser array comprising a first laser device capable of emitting a laser beam of a first polarization from a free surface thereof and a second laser device capable of emitting a laser beam of a second polarization from a free surface thereof, wherein said polarizations are established by the presence of stress inducing elements disposed on said free surfaces of said laser devices, said stress inducing elements comprising a plurality of parallel stripes and wherein said stripes disposed on the free surface of said first laser device are at a non-zero angle with respect to said stripes disposed on the free surface of said second laser device.

13. The dual-beam vertical-cavity surface emitting laser array of claim 12 wherein said stress inducing elements comprise a material having a higher coefficient of thermal expansion than the material which comprises the surface layer of said first and second laser devices.

14. A quad-beam vertical-cavity surface emitting laser array comprising a first laser device capable of emitting a laser beam of a first wavelength and a first polarization from a free surface thereof, a second laser device capable of emitting a laser beam of a second wavelength and a second polarization from a free surface thereof, a third laser device capable of emitting a laser beam of said second wavelength and said first polarization from a free surface thereof, and a fourth laser device capable of emitting a laser beam of said first wavelength and said second polarization from a free surface thereof, wherein said polarizations are established by the presence of stress inducing elements disposed on said free surfaces of said laser devices, said stress inducing elements comprising a plurality of parallel stripes and wherein said stripes disposed on the free surface of said first laser device are orthogonal to said stripes disposed on the free surface of said fourth laser device.

15. The quad-beam vertical-cavity surface emitting laser array of claim 14 wherein all of said laser devices are formed on a substrate and wherein the substrate underlying said first laser device and said fourth laser devices is patterned.

16. The quad-beam vertical-cavity surface emitting laser array of claim 15 wherein said substrate is patterned by formation of a trench therein.

* * * * *